United States Patent
Pan et al.

(10) Patent No.: US 6,198,144 B1
(45) Date of Patent: Mar. 6, 2001

(54) PASSIVATION OF SIDEWALLS OF A WORD LINE STACK

(75) Inventors: Pai-Hung Pan; Martin C. Roberts; Gurtei S. Sandhu; Weimin Li; Christopher W. Hill; Vishnu K. Agarwal, all of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/376,232

(22) Filed: Aug. 18, 1999

(51) Int. Cl.$^7$ ............................................... H01L 21/3205
(52) U.S. Cl. ...................... 257/412; 438/230; 438/297; 438/303; 438/305; 438/592; 438/595; 257/623
(58) Field of Search ...................... 438/595, 305, 438/300, 287, 624, 257, 618, 253, 304, 230, 303, 592, 264, 297

(56) References Cited

U.S. PATENT DOCUMENTS

| | | | |
|---|---|---|---|
| 4,774,201 | 9/1988 | Woo et al. | 438/303 |
| 4,833,099 | 5/1989 | Woo | 438/230 |
| 5,168,072 * | 12/1992 | Moslehi | 438/300 |
| 5,612,249 * | 3/1997 | Sun et al. | 438/297 |
| 5,668,028 * | 9/1997 | Bryant | 438/287 |
| 5,691,223 | 11/1997 | Pittikoun et al. | 438/253 |
| 5,736,455 | 4/1998 | Iyer et al. | 438/592 |
| 5,739,066 * | 4/1998 | Pan | 438/595 |
| 5,817,562 * | 10/1998 | Chang et al. | 438/305 |
| 5,856,223 * | 1/1999 | Wang | 438/264 |
| 5,998,290 * | 12/1999 | Wu et al. | 438/595 |
| 6,015,997 * | 1/2000 | Hu et al. | 257/412 |

FOREIGN PATENT DOCUMENTS 10-189915 * 7/1998 (JP) .

OTHER PUBLICATIONS

S. Wolf, "Silicon Processing for the VLSI Era", Lattic Press, vol. 1 (1986), pp. 182–195 and 335–353.*

* cited by examiner

*Primary Examiner*—Mahshid Saadat
*Assistant Examiner*—José R. Díaz
(74) *Attorney, Agent, or Firm*—Dickstein Shapiro Morin & Oshinsky LLP

(57) ABSTRACT

A method of fabricating an integrated circuit on a wafer includes forming a gate electrode stack over a gate dielectric and forming nitride spacers along sidewalls of the gate electrode stack other than along lowermost portions of the sidewalls. Subsequently, a reoxidation process is performed with respect to the gate dielectric. By providing the nitride spacers along exposed surfaces of conductive barrier and metal layers of the word line stack, those surfaces can be passivated, thereby preventing or reducing the conversion of those layers to non-conductive compounds during the reoxidation process. At the same time, the nitride spacers can be formed so that they do not interfere with the subsequent reoxidation of the gate dielectric. An integrated circuit having a gate electrode stack with nitride spacers extending along sidewalls of the gate electrode stack other than along lowermost portions of the sidewalls is also disclosed.

32 Claims, 11 Drawing Sheets

PASSIVATION OF SIDEWALLS OF A WORD LINE STACK

BACKGROUND

The present invention relates generally to semiconductor devices and, more particularly, to the fabrication of word line stacks.

During the manufacture of some integrated circuits, field effect transistor (FET) gate electrodes and gate electrode interconnects are etched from a thick conductive layer that covers other circuitry. For example, in semiconductor memory circuits, wherever a word lines passes over a field oxide region, it functions as a gate electrode interconnect; wherever the word line passes over a gate dielectric layer overlying an active region, the word line functions as a gate electrode.

In early generations of integrated circuits, gate electrodes and electrode interconnects were often etched from a heavily-doped polycrystalline silicon (polysi) layer. However, fast operational speeds and low stack heights that are desirable for some applications could not be obtained using the polySi layer. Faster operational speeds, for example, are required for certain high-speed processor and memory circuits. Reduced stack heights are desirable for increasing the planarity of the integrated circuit to obtain better photolithographic resolution. To achieve increased operational speeds and lower stack heights in subsequent generations of integrated circuits, it became necessary to reduce the sheet resistance of the conductive layer from which the gates and gate interconnects were formed. A significant improvement in the conductivity of gate electrodes and gate interconnects was obtained by forming a low-resistance metal silicide layer on top of the electrode/interconnect layer.

A silicide is a binary compound formed by the reaction of a metal and silicon (Si) at an elevated temperature. Refractory metal silicides, for example, include a refractory metal, such as tungsten (W) or titanium (Ti), and have relatively high melting points in the range of about 1,400 degrees Celsius (° C.) to greater than about 3,400° C. Metals with a high melting point are preferred for structures, such as gates, that are created early in the fabrication process because the processing of integrated circuit typically involves a series of steps performed at elevated temperatures. In contrast, a metal layer formed at the end of the fabrication process need not have a particularly high melting point. Thus, aluminum (Al), which has a melting point of only about 660° C., generally is used only for the upper level interconnect lines and is applied to the circuitry only after no further processing of the wafer above about 600° C. is required. Although metal silicides have significantly higher conductivity than heavily-doped polySi, a silicide is about an order of magnitude more resistive than the pure metal from which it is formed.

To improve the properties of gates and gate interconnects even further, integrated circuit manufacturers are investigating the use of pure metal layers. Tungsten, for example, is of particular interest because it is relatively inexpensive, has a high melting point (approximately 3,410° C.), and is known to be compatible with current manufacturing techniques.

The use of unreacted tungsten metal as a conductive word line layer can create certain problems during the fabrication process of the integrated circuit. The word line materials often must be capable of withstanding high temperature processing in an oxidizing environment. For example, shortly after the word line stack is patterned, a source/drain reoxidation is performed to repair damage that occurs to the gate oxide near the corners of source and drain regions as a result of etching the word line. The source/drain reoxidation reduces the electric field strength at the gate edge by upwardly chamfering the edge, thereby reducing the "hot electron" effect that can cause threshold voltage shifts. However, during such a reoxidation process, exposed tungsten along the edges or sidewalls of the stack is converted quickly to tungsten trioxide gas at high temperatures in the presence of oxygen. Moreover, sub-limation of the tungsten oxide is not self-limiting. The oxidation of the tungsten layer as well as oxidation of the barrier layer degrades the electrical properties of the word line. Accordingly, passivation of the exposed edges or sidewalls of the tungsten layer and the barrier layer is desirable.

Various techniques have been proposed for passivating the sidewalls of the word line stack prior to reoxidation of the gate dielectric. However, some of the proposed techniques are not easily integrated into standard device fabrication processes, while other techniques do not result in sufficient reoxidation of the gate dielectric in a sufficiently short period of time.

SUMMARY

In general, techniques are disclosed for passivating exposed surfaces of a word line stack such as sidewalls of a metal layer or a conductive barrier layer to help prevent conversion of those layers to a non-conductive compound during a subsequent oxidation process.

According to one aspect, a method of fabricating an integrated circuit on a wafer includes forming a gate electrode stack over a gate dielectric and forming nitride spacers along sidewalls of the gate electrode stack other than along lowermost portions of the sidewalls. Subsequently, a reoxidation process is performed with respect to the gate dielectric.

According to another aspect, a word line stack is formed over a gate dielectric. Forming the word line stack includes forming a polysilicon layer on the gate dielectric and forming a metal layer above the polysilicon layer. Nitride spacers are formed along portions of sidewalls of the word line stack adjacent the metal layer. At least lower portions of sidewalls of the polysilicon layer are not covered by the nitride spacers. Subsequently, a reoxidation process is performed.

Various implementations include one or more of the following features. Forming the nitride spacers can include forming a nitride layer over the wafer, and etching the nitride layer to form the nitride spacers. The nitride layer can be formed, for example, by chemical vapor deposition, and etching the nitride layer can include performing an anisotropic etch such as reactive ion etch process.

Prior to forming the nitride spacers, an oxide layer can be formed adjacent the lowermost portions of the sidewalls of the stack. The oxide layer can be formed, for example, using a high density plasma process, a collimated sputtering process or a flowfill technique. Such techniques can be advantageous in forming an oxide which is thicker on horizontal surfaces of the wafer than on vertical surfaces, such as the sidewalls of stack. In some implementations, an isotropic etch is used to remove portions of the oxide layer so as to expose the sidewalls of the metal layer and/or the conductive barrier layer prior to forming the nitride spacers.

Following formation of the nitride spacers, a portion or substantially all of the oxide formed on the horizontal surfaces can be removed prior to performing the reoxidation.

The oxide can be removed from the horizontal surfaces, for example, using a selective wet etch.

According to another aspect, an integrated circuit includes a semiconductor wafer and a gate dielectric film disposed on a surface of the wafer. A gate electrode stack, which includes multiple layers, is disposed on the gate dielectric film. Nitride spacers extend along sidewalls of the gate electrode stack other than along lowermost portions of the sidewalls.

Some implementations include a polysilicon layer on the gate dielectric film and a metal layer above the polysilicon layer with the spacers extending along sidewalls of the metal layer. The stack also can include a conductive barrier layer between the polysilicon layer and the metal layer, with the spacers extending along sidewalls of the barrier layer as well. In some situations, the spacers have a thickness in the range of about 50 Å to about 500 Å.

One or more of the following advantages are present in some implementations. By providing the nitride spacers along the exposed surfaces of the metal layer and/or the conductive barrier layer, those surfaces can be passivated, thereby preventing or reducing the conversion of those layers to non-conductive compounds. At the same time, the nitride spacers can be formed so that they do not interfere with the subsequent reoxidation process. Thus, the electrical properties of the resulting devices can be improved. In particular, metals such as tungsten can be used as the metal layer of the word line stack to take advantage of tungsten's relatively low expense, high melting point and compatibility with current manufacturing techniques. Reoxidation of the gate dielectric can be performed quickly and efficiently so as to repair damage to the gate dielectric that may occur during earlier fabrication steps, thereby reducing the hot electron effect that can cause threshold voltage shifts.

In addition, forming a non-conformal oxide layer, which is thicker on horizontal surfaces of the wafer than on the sidewalls of the gate stack, prior to etching the nitride spacers can help reduce or eliminate pitting of the underlying semiconductor substrate.

Other features and advantages will be readily apparent from the following detailed description, the accompanying drawings, and the claims.

DETAILED DESCRIPTION

Figure 1:
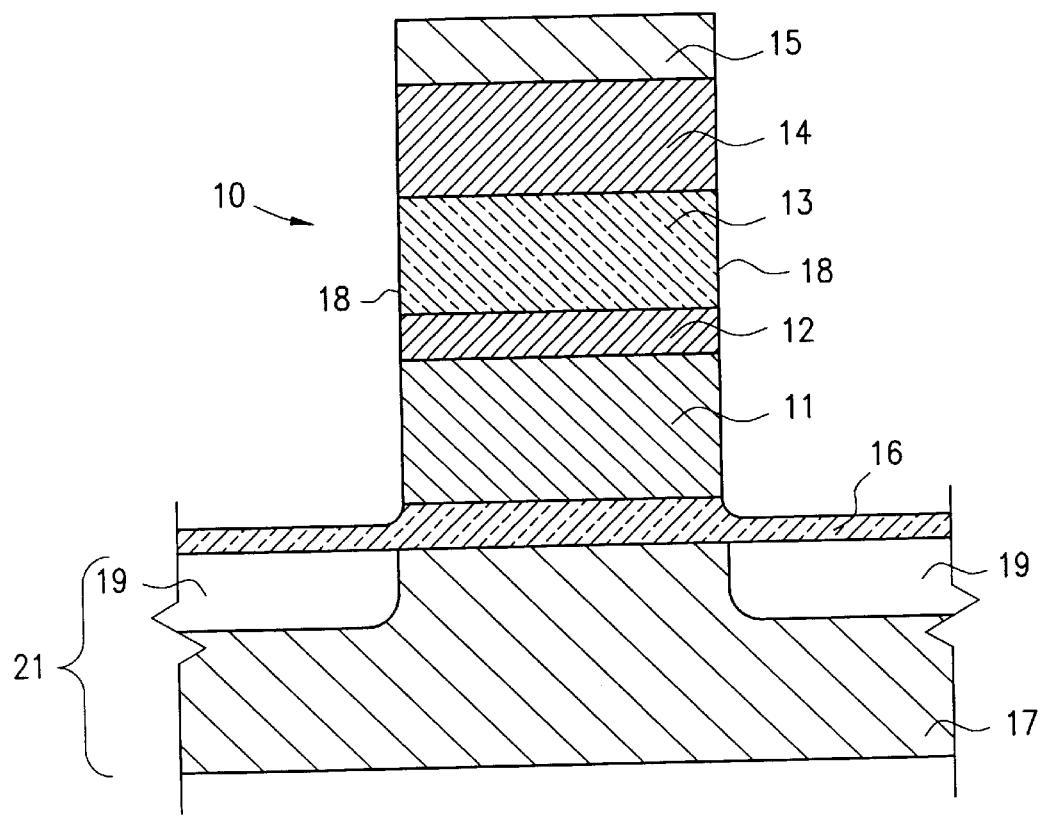
FIG. 1 illustrates a cross-section of an exemplary word line stack.

Referring to FIG. 1, an exemplary word line stack 10 includes a polysilicon layer 11, a conductive barrier layer 12, a metal layer 13, and a cap which can include, for example, a silicon dioxide ($SiO_2$) layer 14 and a nitride layer 15.

The barrier layer 12 should be impermeable to silicon and metal atoms and, in some embodiments, can include tungsten nitride ($WNhd x$) or titanium nitride ($TiN_x$) The metal layer 13 can comprise, for example, aluminum (Al), copper (Cu), or a metal or metal alloy. Exemplary metals include tungsten (W), titanium (Ti), platinum (Pt), palladium (Pd), cobalt (Co), molybdenum (Mo), nickel (Ni), rhodium (Rh) and iridium (Ir).

The word line stack 10 overlies a Si wafer 21 with source and drain regions 19 formed on either side of the stack 10. The polysi layer 11 is insulated from the substrate 17 by a gate dielectric layer 16.

The word line stack 10 can be formed by conventional techniques. For example, the substrate 17 can be oxidized to form the gate dielectric layer 16. Materials for the polySi layer, the barrier layer 12, the metal layer 13, the $SiO_2$ layer 14 and the nitride layer 15 are deposited sequentially, and subsequently are etched to form the stack 10.

The word line stack 10 as shown in FIG. 1 includes an unpassivated barrier layer 12 and metal layer 13 and represents a starting point for the techniques described in greater detail below. The techniques can be used to help passivate the exposed edges or sidewalls 18 of the metal layer 13 and the barrier layer 12 so that the word line stack 10 can be processed further in an oxidizing environment without undergoing conversion of the tungsten or other metal to a non-conductive compound. Additionally, the techniques can allow the oxidizing species to diffuse relatively quickly to the corners of the source and drain regions during the subsequent source/drain reoxidation process.

Figure 2:
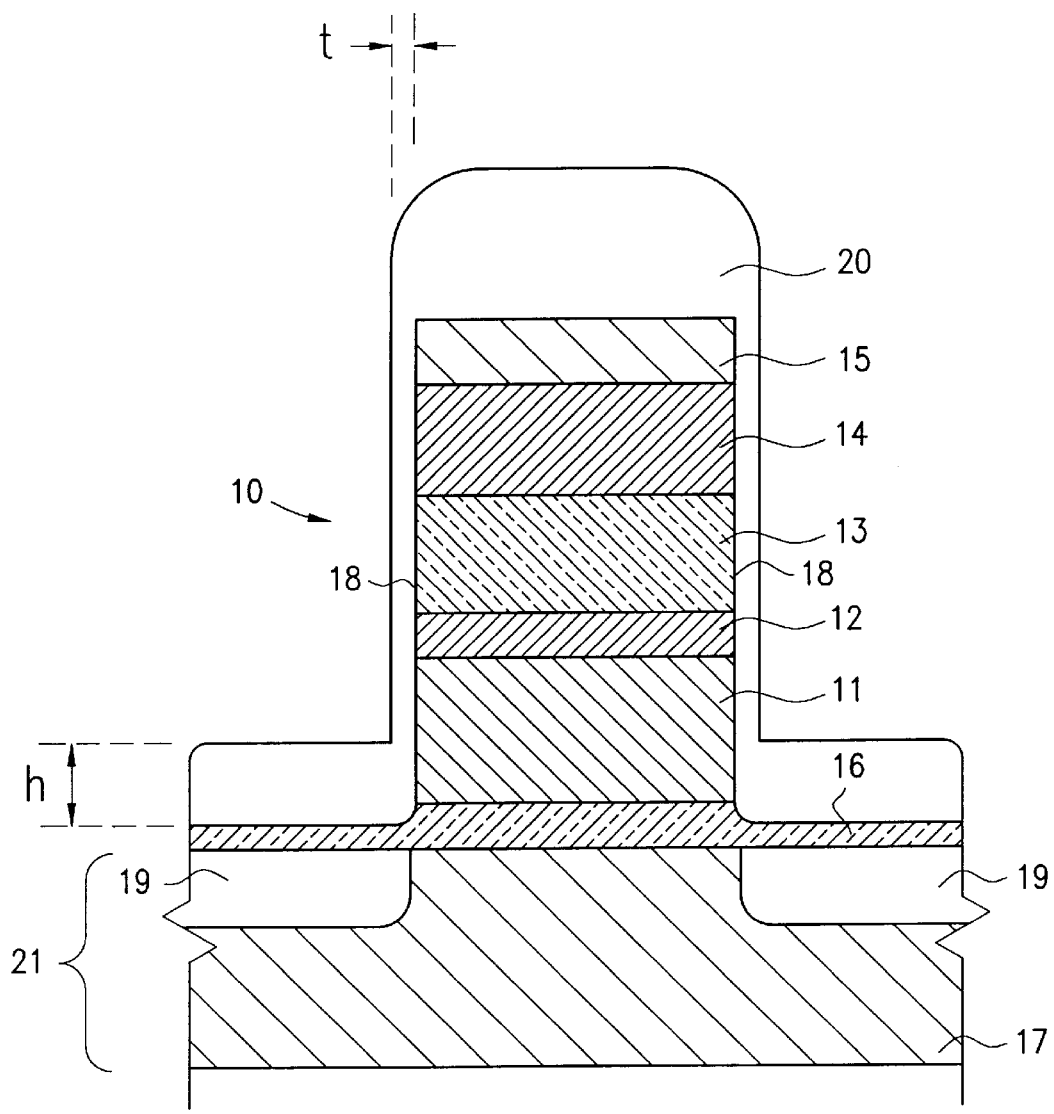
FIGS. 2 through 4 illustrate cross-sections of an exemplary word line stack during passivation of the sidewalls of the stack according to the invention.

Referring to FIG. 2, an oxide layer 20 is formed over the word line stack 10 and the gate dielectric layer 16. Preferably, the oxide layer 20 should be formed so that a relatively thick oxide film with a height h is provided over horizontal surfaces of the wafer, whereas a relatively thin oxide film with a thickness t is provided along the vertical surfaces including the sidewalls or edges 18 of the stack 10.

According to one implementation, the oxide layer 20 is formed, for example, using a high density plasma (HDP) technique or a collimated sputtering technique. According to another implementation, the oxide layer 20 is formed using a flowfill technique. Such techniques are suitable for providing an oxide layer with the height h greater than the thickness t. Preferably, the height h of the oxide layer 20 along the horizontal surfaces should not extend above the lower surface of the polySi layer 11.

In general, using either a HDP or collimated sputtering technique, the height h and thickness t of the oxide layer 20 will depend on the particular process parameters used and the topography of the devices formed on the wafer. In one exemplary implementation, the height h of the oxide layer 20 on the horizontal surfaces can be on the order of about 200 angstroms (Å), whereas the thickness t of the oxide layer 20 formed along the sidewalls 18 is only about 50 Å. In that case, the ratio of the height h to the thickness t would be on the order of about 4 to 1. In another exemplary implementation, the height h of the oxide layer 20 on the horizontal surfaces is on the order of about 1,000 angstroms (Å), whereas the thickness t of the oxide layer 20 formed along the sidewalls 18 is only about 400 Å. The temperature during formation of the oxide layer 20 should be kept sufficiently low so that little or none of the barrier layer and metal layer 12, 13 is converted to oxide. Thus, for example, if the barrier layer 12 comprises $WN_x$ and the metal layer 13 comprises W, the oxide layer 20 can be formed at a temperature in the range of about 30° C. to about 650° C.

To form the oxide layer 20 using a flowfill technique, the semiconductor wafer with the word line stack 10 can be placed in a reaction chamber, such as a parallel plate CVD chamber, with silane gas and hydrogen peroxide provided to the chamber interior in the vicinity of the wafer. The silane gas and the hydrogen peroxide react to form $SiOH_4$. Preferably, the temperature should be about 0 degrees celsius (° C.) or lower. Ratios of the height h of the oxide layer 20 to its thickness t along the sidewalls of the stack 10 can be on the order of about 10 to 1, and even as high as about 100 to 1.

Optionally, if a flowfill technique is used to form the oxide layer 20, an elevated temperature treatment can be performed to help reduce the water content of the oxide film. Such elevated temperature treatments include, for example, anneal processes at a temperature greater than 100° C., and typically in the range of about 300–500° C. Alternatively, a plasma treatment or a radiation treatment can be performed.

Figure 3:
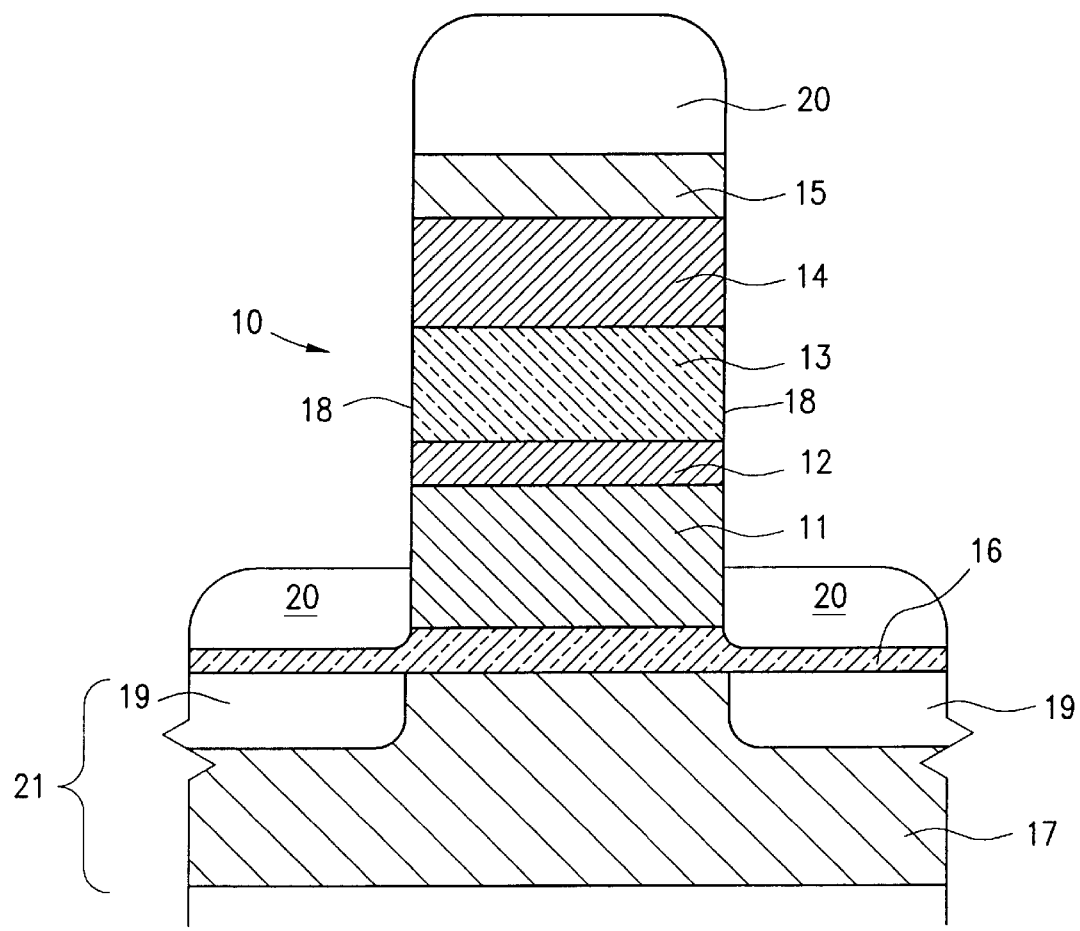

Following formation of the oxide layer 20, an isotropic etch optionally is performed to remove substantially all the oxide 20 from the sidewalls 18 (FIG. 3). In one particular implementation, a hydrofluoric acid (HF) solution or a N,N,N, trimethyl hydroxide (TMAH) and HF solution can be used. Alternatively, a dry isotropic etch can be used to remove the oxide 20 from the sidewalls 18. In any event, the etchant should be selected so that the layers that form the word line stack 10 are not etched. In some applications, little or no oxide may be formed along the sidewalls 18 and, thus, the isotropic etch to remove the oxide 20 need not be performed.

Figure 4:
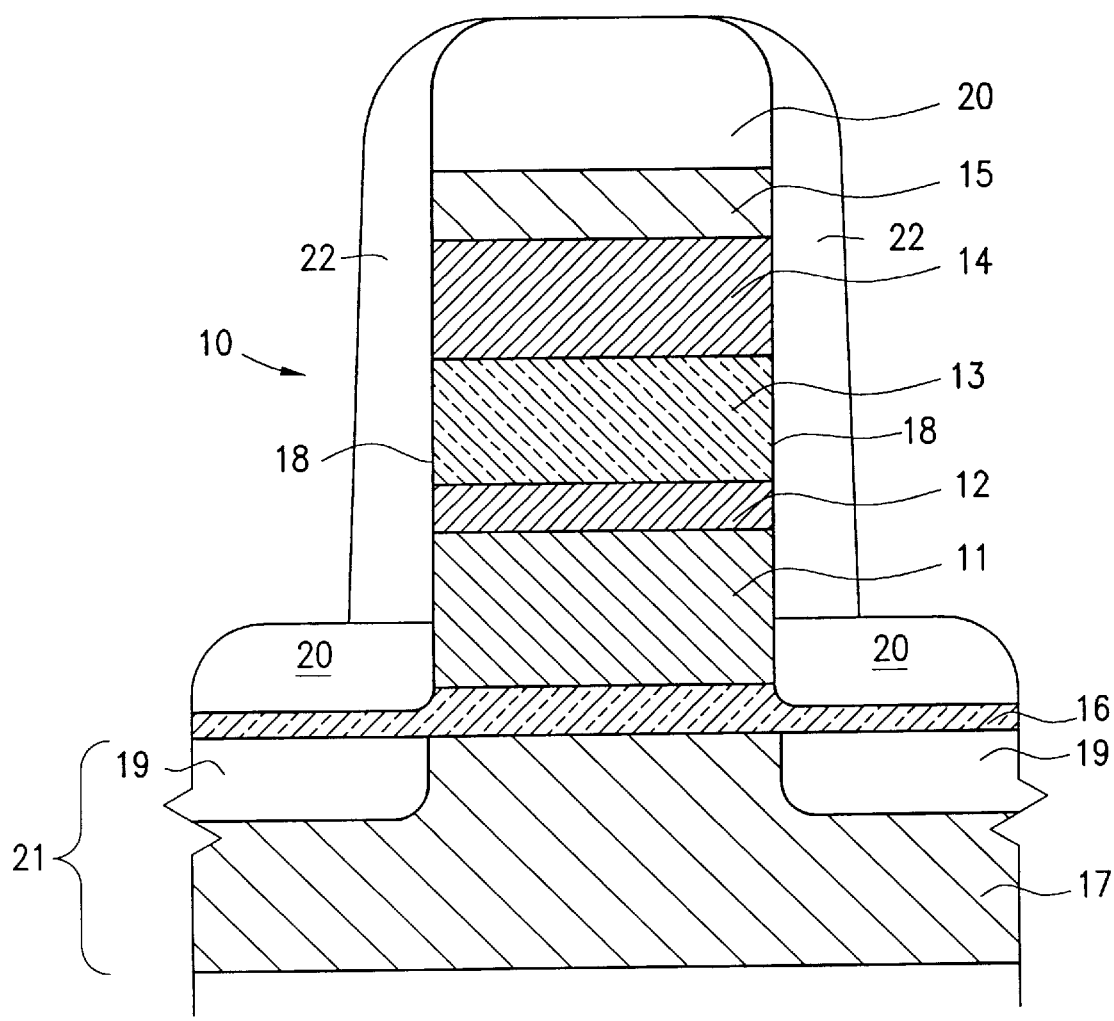

Next, a substantially conformal nitride layer is deposited over the wafer, for example, by chemical vapor deposition (CVD) or plasma-enhanced CVD (PECVD), and an anisotropic or directional etch is carried out to form nitride spacers 22 along the surfaces or sidewalls 18 of the stack 10 (FIG. 4). For example, a reactive ion etching (RIE) technique or a sputtering technique can be used to form the nitride spacers 22 which, in some implementations, have a thickness in the range of about 50 Å to about 500 Å. The nitride spacers 22, which can comprise, for example, silicon nitride ($Si_xN_y$), should extend at least along portions of the sidewalls 18 at which the metal layer 13 and the barrier layer 12 previously were exposed. The nitride spacers 22, however, do not extend to the lower portion of the sidewalls of the polySi layer 11 which remains covered by the oxide layer 20. Use of a non-conformal oxide layer 20, which is relatively thick over the horizontal surfaces of the substrate, can help avoid pitting of the silicon substrate during etching of the nitride spacers.

Figure 5:
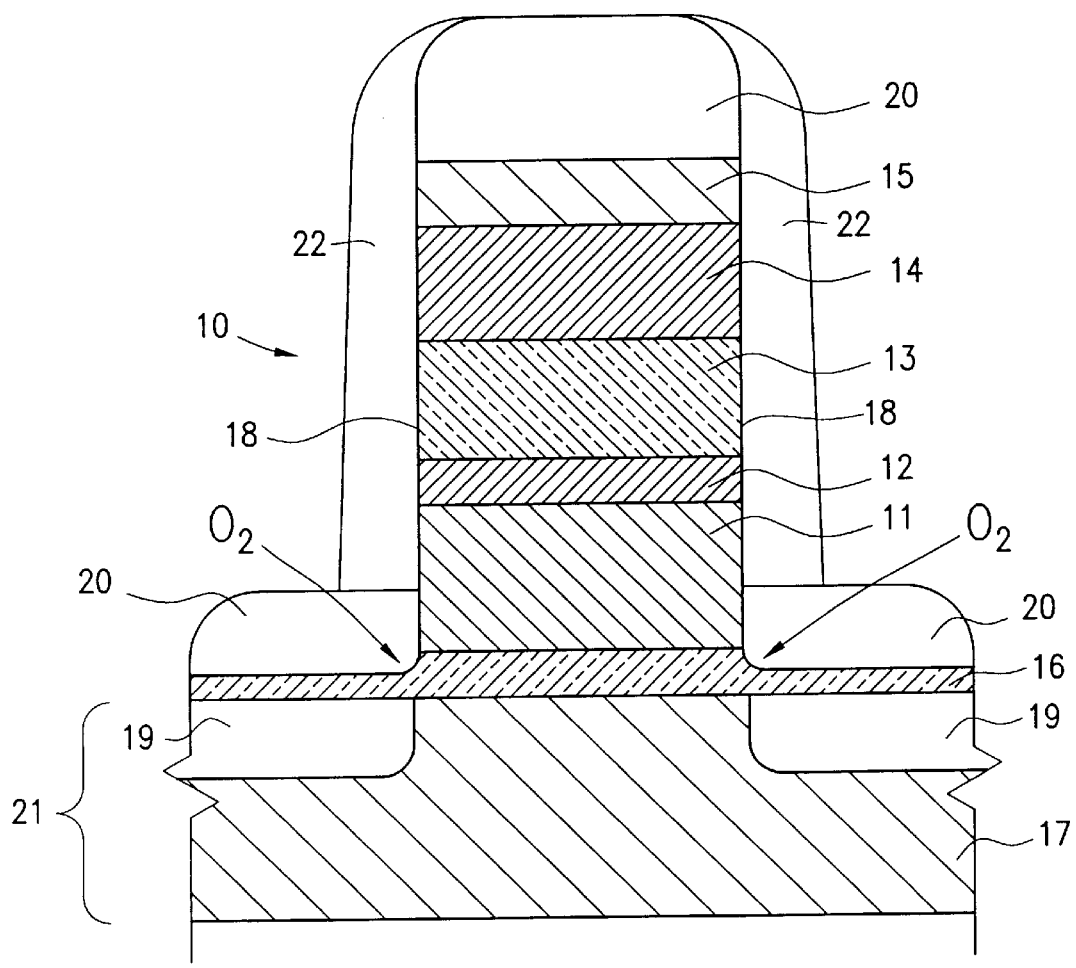
FIG. 5 illustrates the word line stack during a drain/source reoxidation according to the invention.

Following formation of the nitride spacers 22, a source/drain dopant anneal can be performed, and a source/drain reoxidation is carried out using standard techniques. The reoxidation process can include providing an oxygen-containing gas, such as $H_2O$ or $O_2$ to a vicinity of the wafer. In one implementation, the reoxidation is carried out with the oxide layer 20 intact (FIG. 5). As the reoxidation process takes place, oxygen diffuses through the oxide layer 20 to the corners of the source and drain regions 19.

The duration of the reoxidation process may be slightly longer than if it were performed in the absence of the oxide layer 20 because the oxygen must first diffuse through the oxide layer. Nevertheless, compared to an oxide layer 20 formed using a sputtering or high density plasma technique, an oxide layer 20 formed using a flowfill technique can have a density which allows for a relatively high flux of the oxidizing species to diffuse through the oxide layer toward the source and drain regions 19.

During the reoxidation process, the nitride spacers 22 serve as a barrier to prevent the oxygen from interacting with the metal layer 13 and the barrier layer 12. The spacers 22, therefore, passivate those layers and prevent the conversion of those layers to a metal oxide or metal oxynitride. Thus, the combination of the nitride spacers 22 and the oxide layer 20 allows reoxidation near the corners of the source and drain regions 19 while at the same time preventing or reducing oxidation of the barrier and metal layers 11, 12 in the word line stack 10.

Figure 6:
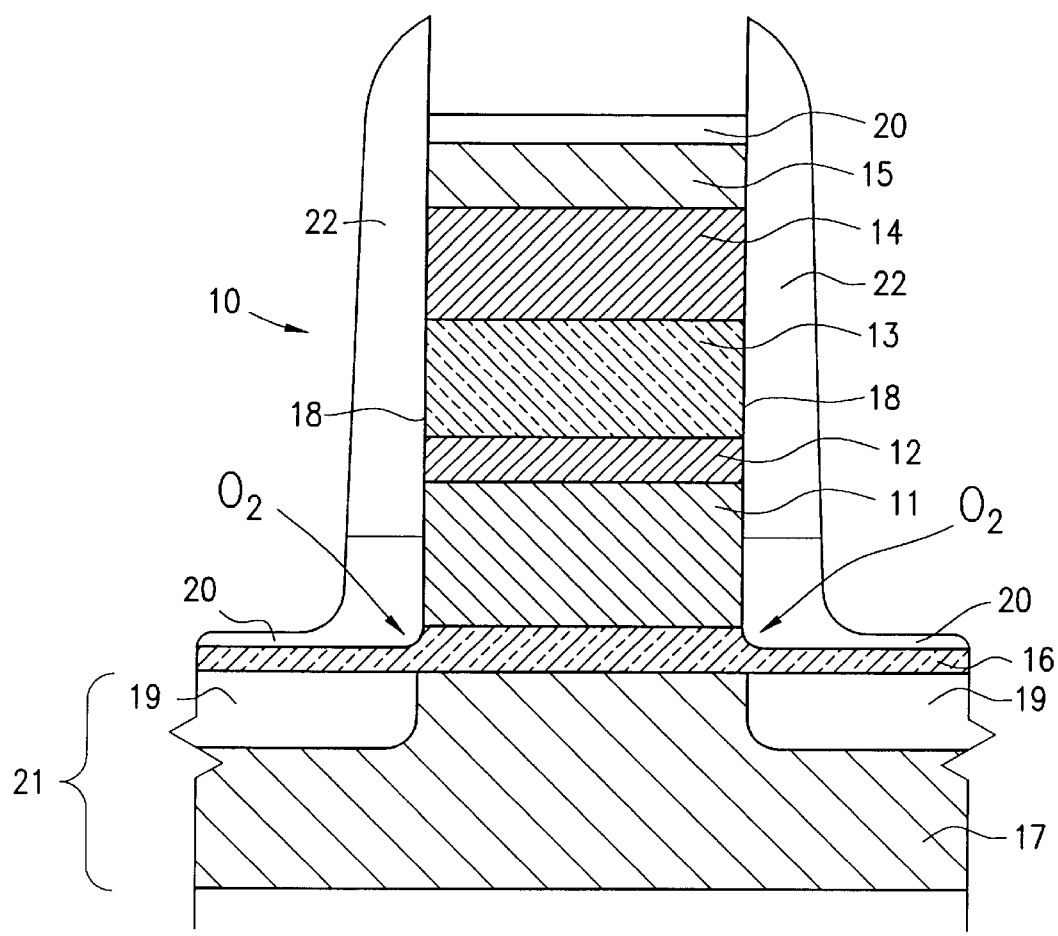
FIG. 6 illustrates the word line stack during a drain/source reoxidation according to an alternative embodiment of the invention.
Figure 7:
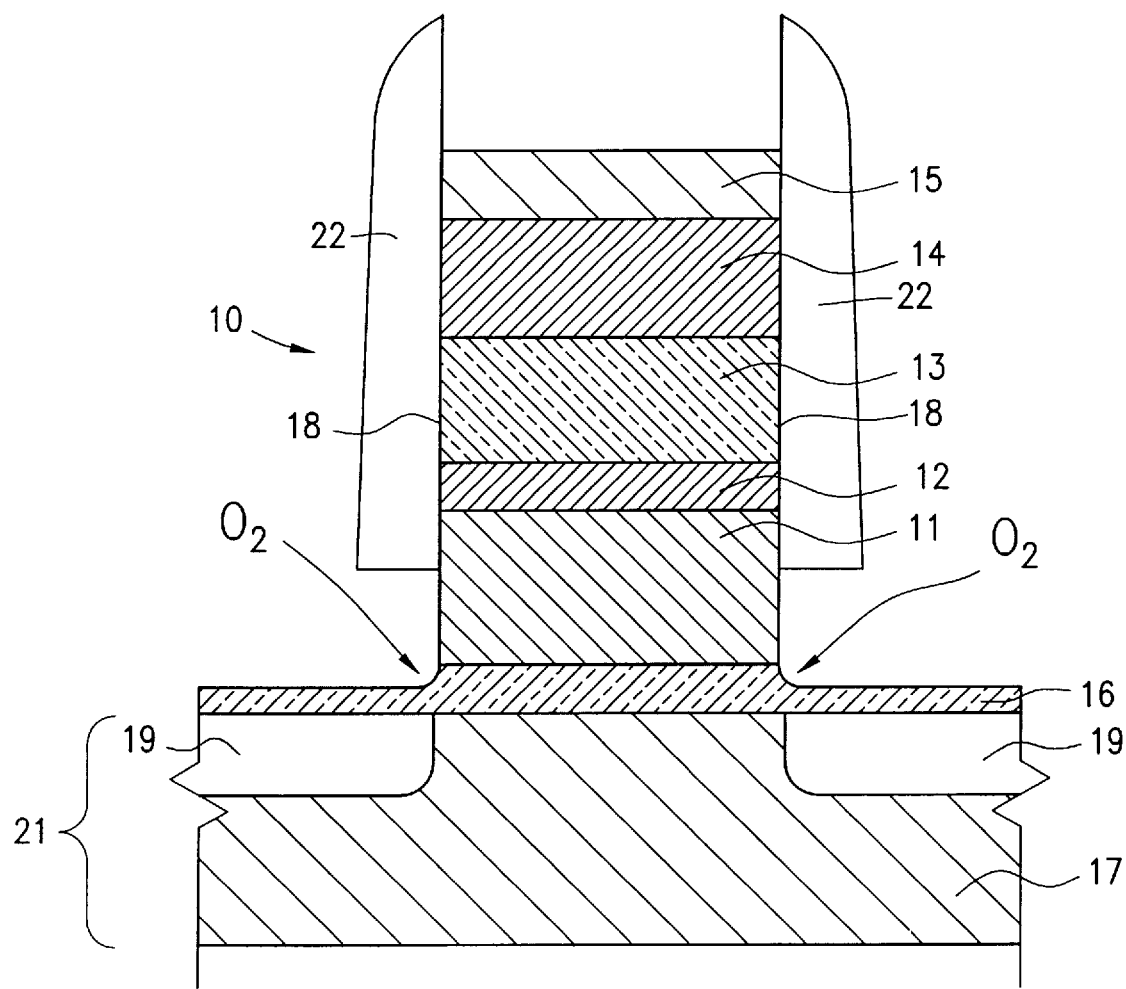
FIG. 7 illustrates the word line stack during a drain/source reoxidation according to yet another embodiment of the invention.

Alternatively, prior to performing the source/drain reoxidation process, a selective wet etch can be performed to remove a portion of the oxide layer 20 remaining over the source and drain regions 19 (FIG. 6) or to remove substantially all of the oxide layer 20 remaining over the source and drain regions 19 (FIG. 7). The source/drain reoxidation process then is performed with the nitride spacers 22 acting as a barrier to the oxygen atoms to prevent oxidation of the metal and/or barrier layers 12, 13.

Figure 8:
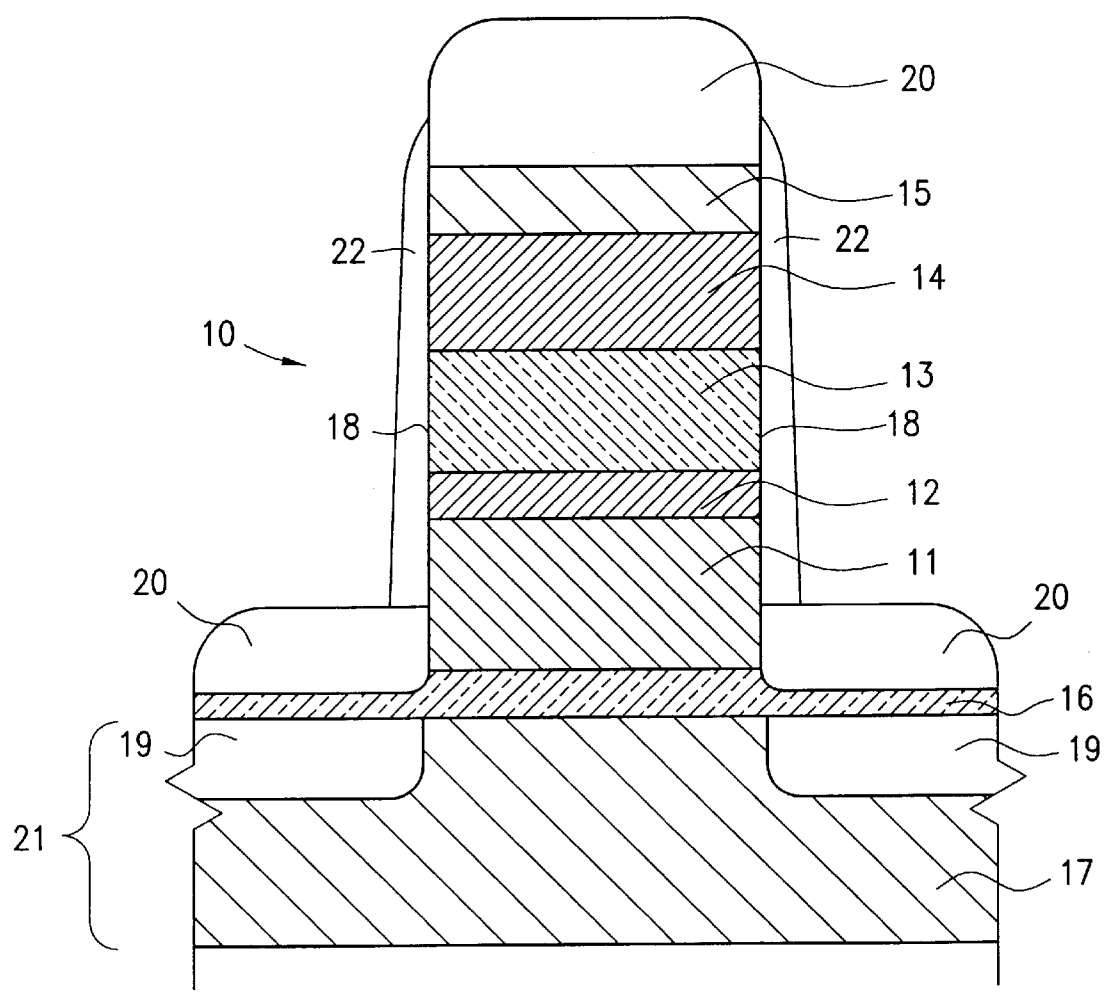
FIGS. 8 and 9 illustrate passivation of the sidewalls of the word line stack according to another embodiment of the invention.
Figure 9:
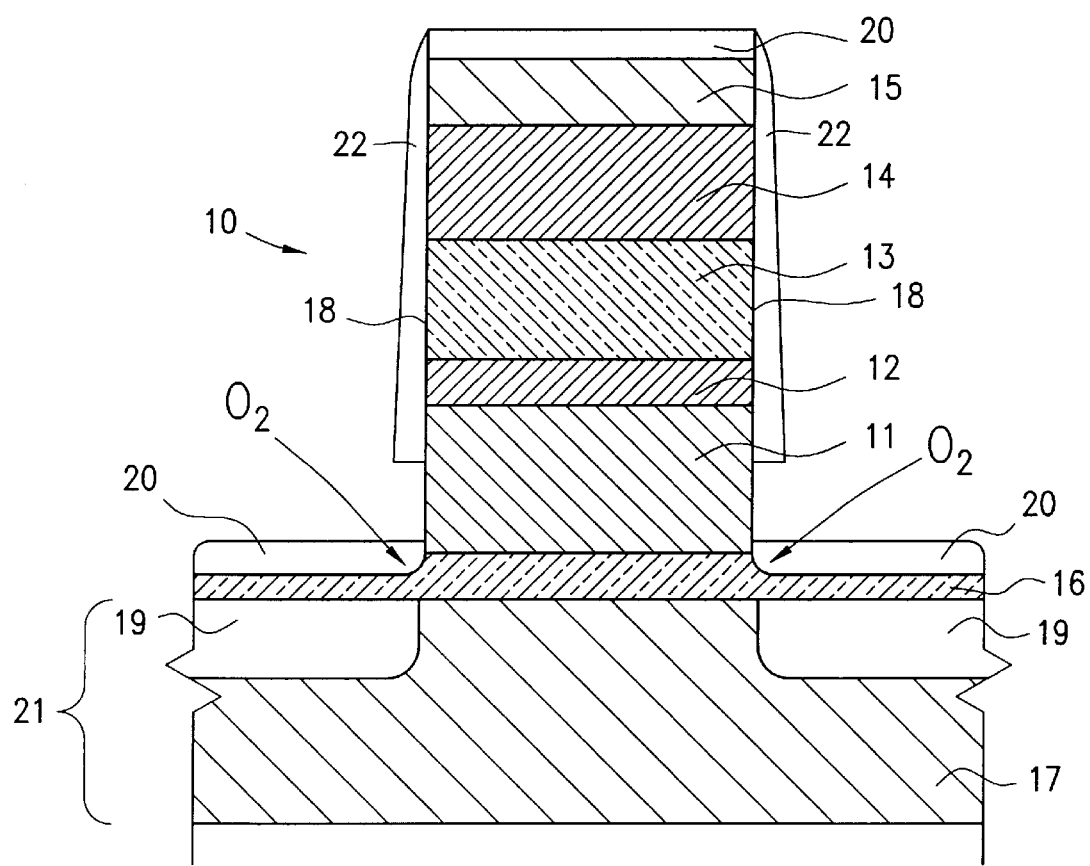

As can be seen from FIGS. 6 and 7, if the oxide layer 20 is partially or completely removed prior to the source/drain reoxidation, the upper portion of the nitride spacers 22 may extend beyond the top of the stack 10. In general, nitride spacers that extend beyond the top of the stack 10 are not desirable because they make subsequent processing more difficult. To provide spacers that extend to about the same height as the resulting stack 10, the nitride spacers 22 can be over-etched slightly during formation of the spacers (see FIG. 8). The extent of the over-etching that is desirable will depend on the amount of the oxide layer 20 that is to be subsequently removed prior to the source/drain reoxidation. The amount of over-etching of the nitride spacers 22 can be controlled so that following removal of part of all of the oxide layer 20 the top of the stack 10 and the top of the nitride spacers 22 are at about the same height (see FIG. 9).

Figure 10:
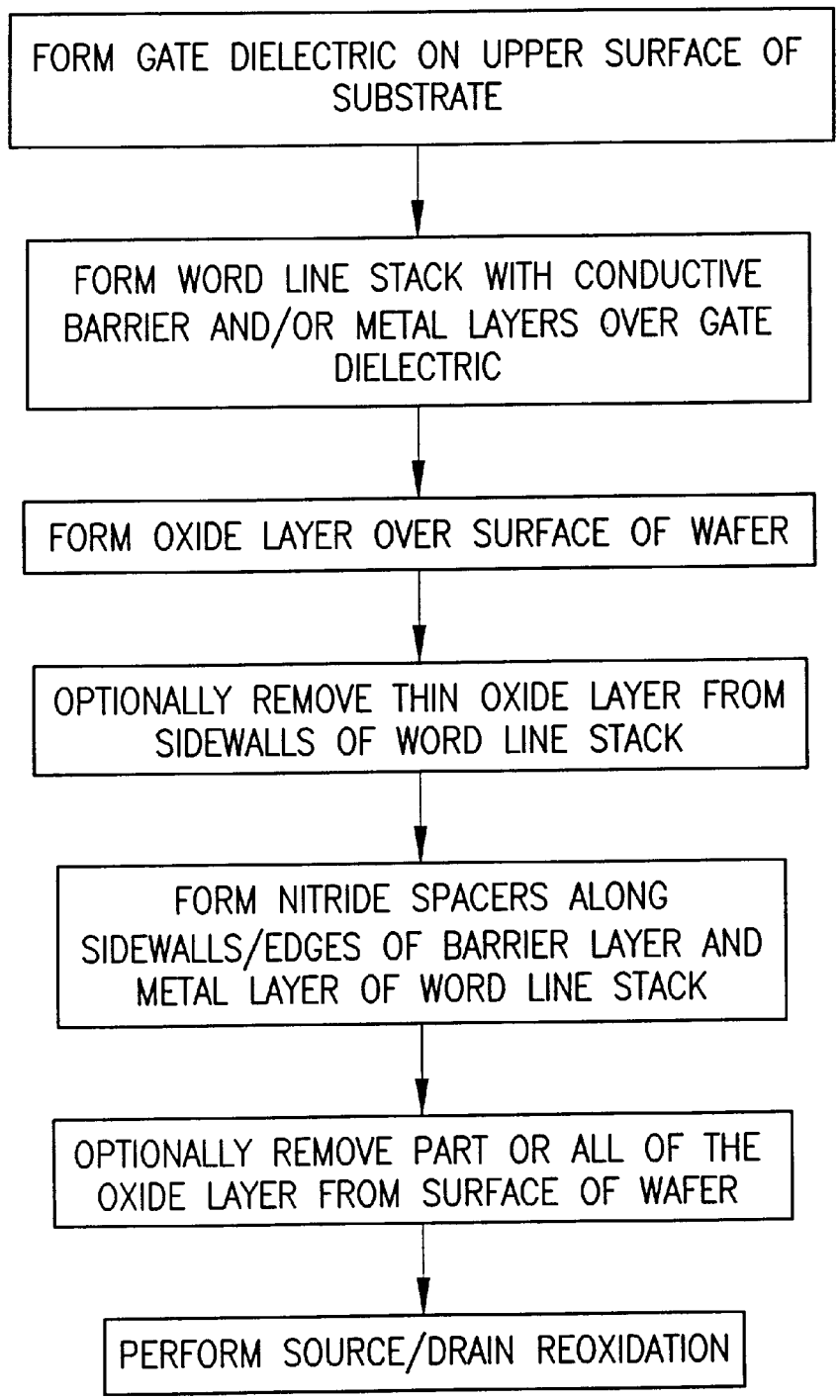
FIG. 10 is a flow chart of a method according to the invention.

FIG. 10 is a flow chart of some of the acts that are performed during some implementations.

Figure 11:
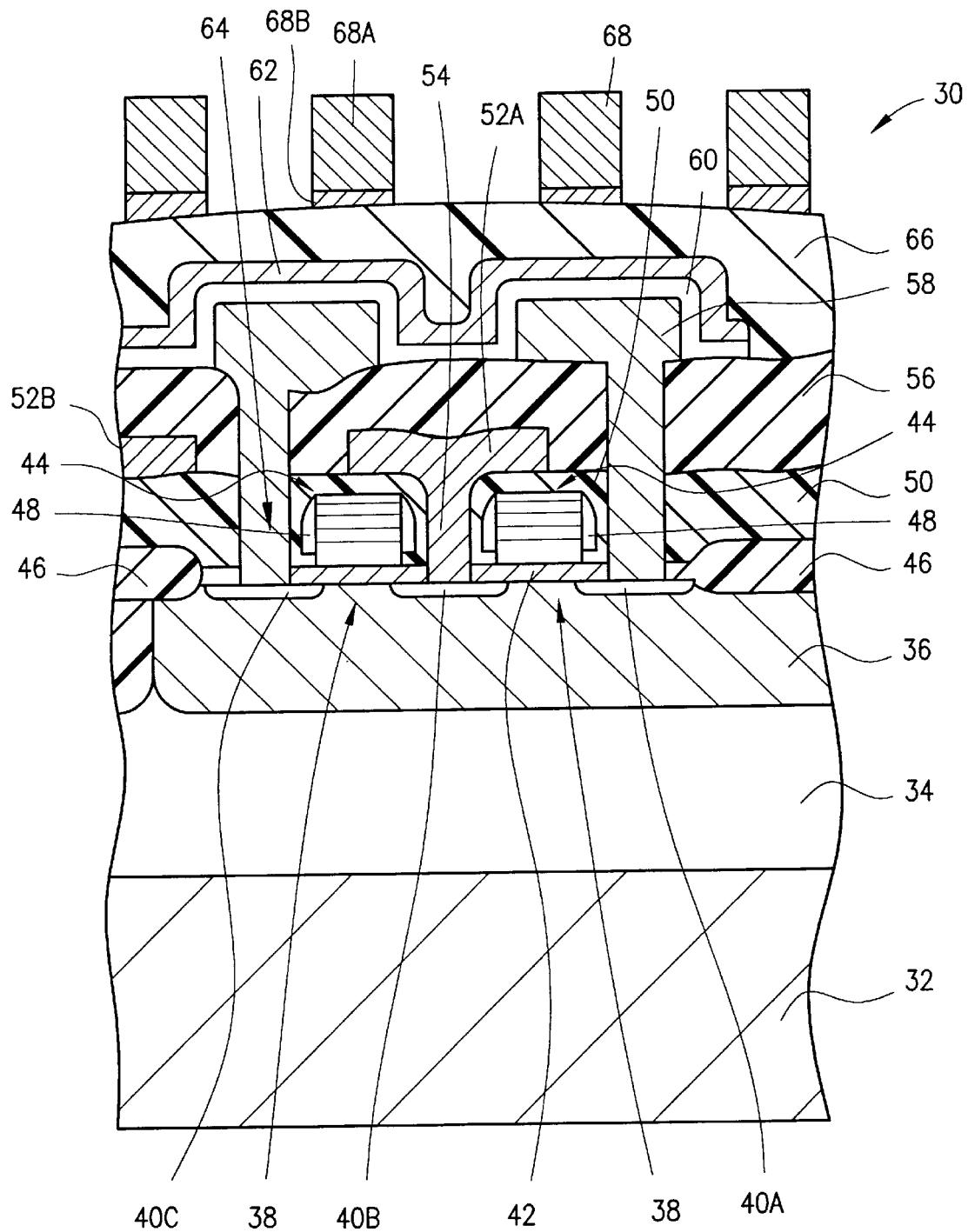
FIG. 11 illustrates a cross-section of an exemplary integrated circuit including word line stacks passivated according to the invention.

Referring to FIG. 11, an exemplary semiconductor memory device 30 incorporates word line stacks that form gate electrodes 44 with nitride spacers 48 which extend partially along the sidewalls of the word line stacks.

The device 30 includes an n-type well 34 formed in a p-type silicon substrate 32, and a p-type well 36 formed in the n-type well 34. At the surface of the p-type well 36, a pair of transistors 38 are formed and constitute a memory cell of the device 30. Field oxide regions 46 separate the transistors 38 from other devices formed on the semiconductor wafer.

Each of the transistors 38 includes n-type source/drain regions 40A, 40B, 40C, a gate dielectric film 42, and a stacked gate electrode 44. Each stacked gate electrode 44 can include a polysilicon layer, a conductive barrier layer, a metal layer, and a cap which can include a $SiO_2$ layer 14 and a nitride layer, as described above with respect to FIG. 1. Nitride spacers 48 extend partially along the sidewalls of the gate electrodes 44 and, in particular, cover the sidewalls of the respective barrier and metal layers.

A first interlayer insulating film 50 is formed over gate electrodes 44, and a metal bit line 52 is connected to the source/drain region 40B through a contact hole 54. The bit line 52A and 52B is covered with a second interlayer insulating film 56. Capacitive elements are formed above the insulating film 56. The stacked-type capacitive elements include a lower electrode 58, a capacitor insulating film 60, and an upper electrode 62. Each of the paired lower electrodes 58 is electrically connected to a respective one of the source/drain regions 40A, 40C through contact holes 64 which extend through the first and second interlayer insulating films 50, 56. The capacitive elements are covered with a third interlayer insulating film 66, and metal wiring 68A and 68B is provided on the surface of the third interlayer insulating film to access bit lines, capacitor nodes and/or transistors.

As can be seen in FIG. 11, the nitride spacers 48 do not extend all the way to the bottom of the stacked gate electrodes 44. Specifically, the nitride spacers 48 do not completely cover the sidewalls of the polysilicon layer that forms the lowermost layer of the gate electrodes 44. As discussed previously, the nitride spacers 48 allow re-oxidation of the gate dielectric film 42 near the corners or edges of the source and drain regions 40A, 40B, 40C while at the same time preventing or reducing oxidation of the barrier and metal layers in the gate electrode stacks 44. The invention, thus, allows devices with increased operational speeds to be obtained by incorporating, for example, pure metal layers such as tungsten into the word line stack. Moreover, reoxidation of the gate dielectric can be performed quickly and efficiently so as to repair damage to the gate dielectric that may occur during earlier fabrication steps, thereby reducing the hot electron effect that can cause threshold voltage shifts.

Other implementations are within the scope of the following claims.

What is claimed is:

1. A method of fabricating an integrated circuit on a wafer, the method comprising:
    forming a gate electrode stack over a first part of a gate dielectric;
    forming an oxide layer over a second part of said gate dielectric and said gate electrode stack, including sidewalls of the gate electrode stack, and removing portions of the oxide layer to expose upper portions of said sidewalls;
    forming nitride spacers along said sidewalls of the gate electrode stack other than along lowermost portions of the side walls;
    removing at least a portion of the oxide layer; and
    subsequently performing a reoxidation process with respect to the gate dielectric.

2. The method of claim 1 wherein said oxide layer is formed on said gate dielectric so as to be adjacent lowermost portions of the sidewalls.

3. The method of claim 2 wherein the oxide layer is formed using a high density plasma process.

4. The method of claim 2 wherein the oxide layer is formed using a collimated sputtering process.

5. The method of claim 2 wherein the oxide layer is formed using a flowfill technique.

6. The method of claim 2 wherein the oxide layer is formed using a process that results in a thicker oxide being formed on the second part of said gate dielectric than along the sidewalls of the gate electrode stack.

7. The method of claim 6 wherein, following the act of forming the nitride spacers, said at least a portion of the oxide layer is removed from the second part of said gate dielectric prior to performing the reoxidation process.

8. The method of claim 7 wherein said oxide layer is also formed at the top of the gate electrode stack such that following said removal act, the top of said gate electrode stack and the top of said spacers are at about the same height.

9. The method of claim 6 wherein the oxide layer is removed from the second part of said gate dielectric using a selective wet etch.

10. The method of claim 6 wherein substantially all the oxide layer is removed the second part of said gate dielectric prior to performing the reoxidation.

11. The method of claim 6 wherein the ratio of thickness between the oxide formed on the second part of said gate dielectric and along the sidewalls of the gate electrode stack is about 100 to 1.

12. The method of claim 2 wherein forming said nitride spacers includes:
    forming a nitride layer over the wafer; and
    etching the nitride layer to form the nitride spacers.

13. The method of claim 12 wherein forming a nitride layer includes depositing a nitride layer by chemical vapor deposition.

14. The method of claim 12 wherein etching the nitride layer includes performing an anisotropic etch.

15. The method of claim 12 wherein etching the nitride layer includes performing a reactive ion etch process.

16. The method of claim 1, wherein said forming of said nitride spacers is performed so that said nitride spacers and said oxide layer are not co-extensive along said side walls.

17. A method of fabricating an integrated circuit on a wafer, the method comprising:
    forming a word line stack over a gate dielectric, wherein forming the word line stack includes forming a polysilicon layer on the gate dielectric and forming a metal layer above the polysilicon layer;
    forming oxide layer over said wafer including said word line stack and removing portions of the oxide layer to expose upper portions of the sidewalls of said word line stack;
    forming nitride spacers along said upper portions of said sidewalls of the word line stack adjacent the metal layer, wherein at least lower portions of sidewalls of the polysilicon layer are not covered by the nitride spacers;
    removing at least a portion of the oxide layer which is formed on substantially horizontal surfaces of said wafer; and
    subsequently performing a reoxidation process.

18. The method of claim 17 wherein forming the word line stack further includes forming a barrier layer above the polysilicon layer, and wherein forming nitride spacers includes forming nitride spacers along portions of the sidewalls of the word line stack adjacent the barrier layer.

19. The method of claim 17 further including:
    forming said oxide layer over the wafer prior to forming the nitride spacers, wherein the oxide layer is thicker on substantially horizontal surfaces than along substantially vertical surfaces.

20. The method of claim 19 wherein the oxide layer is at least about four times thicker on the substantially horizontal surfaces than along the substantially vertical surfaces.

21. The method of claim 20 wherein the oxide layer is at least about ten times thicker on the substantially horizontal surfaces than along the substantially vertical surfaces.

22. The method of claim 20 including removing substantially all of said oxide layer on the substantially horizontal surfaces prior to performing said reoxidation process.

23. The method of claim 19 wherein the oxide layer is formed using a high density plasma process.

24. The method of claim 19 wherein the oxide layer is formed using a collimated sputtering process.

25. The method of claim 19 wherein the oxide layer is formed using a flowfill technique.

26. The method of claim 19 further including removing portions of the oxide layer to expose the portions of the sidewalls adjacent the metal layer prior to forming the nitride spacers.

27. The method of claim 17, wherein said forming of said nitride spacers is performed so that said nitride spacers and said oxide layer are not co-extensive along said side walls.

28. A method of fabricating an integrated circuit on a wafer, the method comprising:

sequentially forming a polysilicon layer, a conductive barrier layer, and a metal layer over a gate dielectric formed on the wafer;

etching the polysilicon, conductive barrier and metal layers to form at least one gate electrode stack;

forming an oxide layer adjacent lower portions of sidewalls of the polysilicon layer, wherein said oxide layer is formed over said lower portions of the sidewalls of the polysilicon layer by first forming said oxide layer over said wafer including the sidewalls of said gate electrode stack and then removing said oxide layer from upper portions of said sidewalls;

providing nitride spacers along sidewalls of the conductive barrier and metal layers; and performing a reoxidation process with the nitride spacers serving as a barrier to prevent an oxidizing species from interacting with the metal layer and the barrier layer.

29. The method of claim 28 wherein the height of said oxide layer on the horizontal surfaces of said wafer is greater than the thickness of said oxide layer on the vertical side walls of said gate stack electrode of said wafer.

30. The method of claim 29 wherein the ratio of said height to said thickness is as high as about 100 to 1.

31. The method of claim 30 wherein at least a portion of said oxide layer is removed prior to performing said reoxidation process.

32. The method of claim 31 wherein substantially all of said oxide layer is removed prior to performing said reoxidation process.

* * * * *

UNITED STATES PATENT AND TRADEMARK OFFICE
CERTIFICATE OF CORRECTION

PATENT NO. : 6,198,144 B1
DATED : March 6, 2001
INVENTOR(S) : Pai-Hung Pan et al.

It is certified that error appears in the above-identified patent and that said Letters Patent is hereby corrected as shown below:

<u>Title page,</u>
Item [75], "Inventors:", Inventor Gurtei S. Sandhu's first name is misspelled. It should read, -- Gurtej S. Sandhu --.

OTHER PUBLICATIONS,
"Lattic Press is misspelled. It should read, -- Lattice Press --.

<u>Column 1,</u>
Line 19, reads "polysi" should read -- polySi --

<u>Column 4,</u>
Line 5, reads "(WNhd x)" should read -- (WN$_x$) --
Line 13, reads "polysi" should read -- polySi --

<u>Column 8,</u>
Line 5, reads "removed the" should read -- removed from the --

Signed and Sealed this

Nineteenth Day of March, 2002

Attest:

Attesting Officer

JAMES E. ROGAN
*Director of the United States Patent and Trademark Office*